United States Patent [19]

Larson

[11] 4,385,213
[45] May 24, 1983

[54] SWITCH AND COMPONENT ATTACHMENT TO FLEXIBLE PRINTED CIRCUITRY

[75] Inventor: Willis A. Larson, Crystal Lake, Ill.

[73] Assignee: Oak Industries, Inc., Rancho Bernardo, Calif.

[21] Appl. No.: 211,826

[22] Filed: Dec. 1, 1980

[51] Int. Cl.³ .................... H01H 13/70; H05K 1/00
[52] U.S. Cl. .................... 200/5 A; 200/292; 200/314; 361/398
[58] Field of Search ............. 200/5 A, 159 B, 292, 200/314, 317; 361/397, 398, 401, 408, 416

[56] References Cited

U.S. PATENT DOCUMENTS 3,766,350 10/1973 Van Dyk et al. .............. 200/314
3,978,297 8/1976 Lynn et al. .................... 200/5 A
4,022,993 5/1977 Shattuck ...................... 200/314 X
4,056,701 11/1977 Weber ........................ 200/159 B X
4,066,851 1/1978 White et al. .................. 200/292 X
4,163,138 7/1979 Harden ....................... 200/317 X Primary Examiner—J. R. Scott
Attorney, Agent, or Firm—Kinzer, Plyer, Dorn & McEachran

[57] ABSTRACT

An electrical component attachment for securing discrete components to a rigid circuit board without the use of plated-through holes. A unitary sheet member has a membrane portion and a flap portion. The membrane portion lies on one side of the circuit board. The flap portion wraps around an edge of the circuit board and is adhesively secured to the other side of the board. An electrical component is disposed between the flap portion and the board so as to be secured thereto by the flap portion. The sheet has conductive traces which contact the leads of the electrical component, providing electrical connection thereto. The sheet may have a tail onto which the traces extend for connection to external circuitry.

7 Claims, 3 Drawing Figures

U.S. Patent May 24, 1983 4,385,213
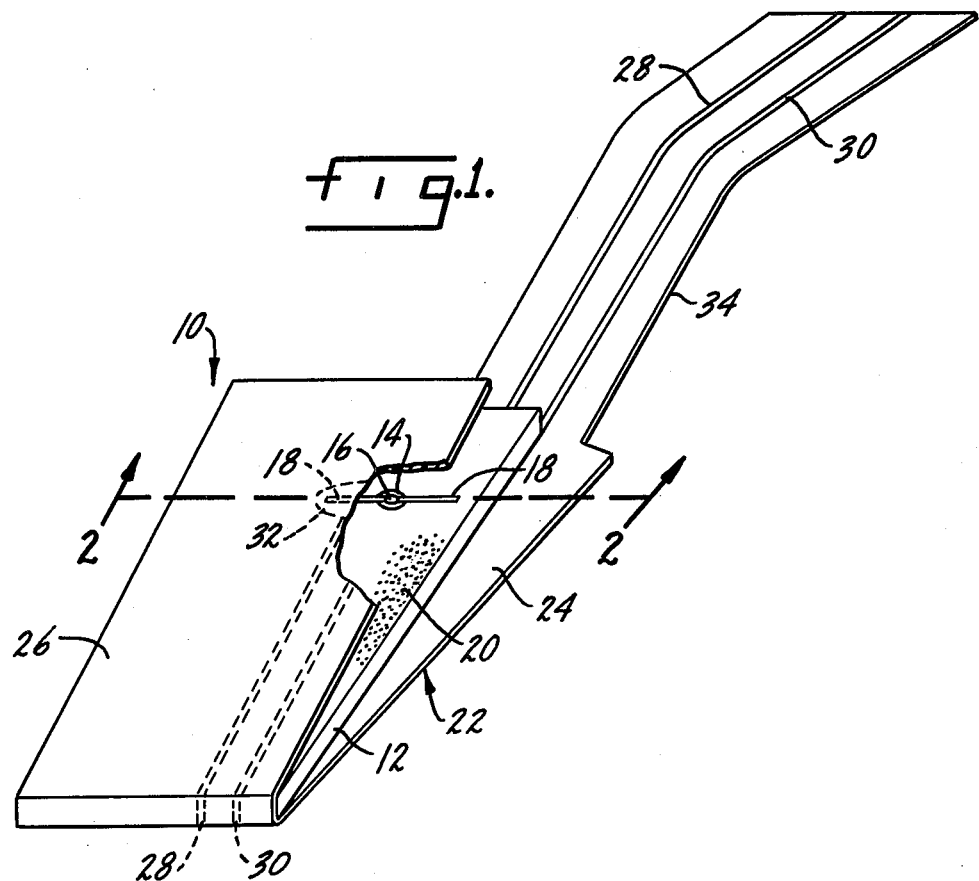
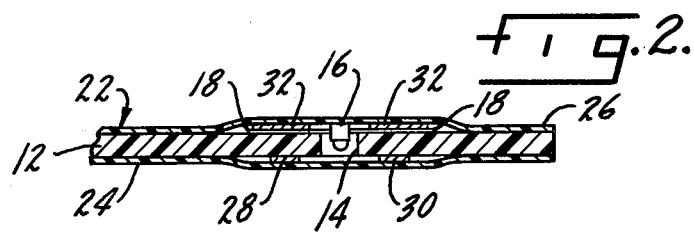
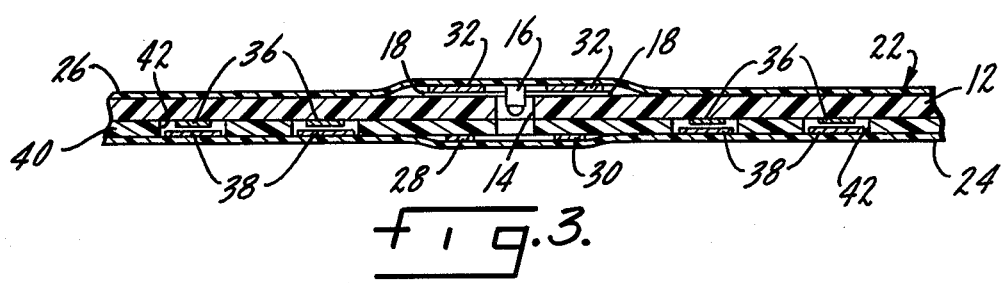

SWITCH AND COMPONENT ATTACHMENT TO FLEXIBLE PRINTED CIRCUITRY

SUMMARY OF THE INVENTION

This invention relates to connections for electrical components. It is particularly concerned with incorporating discrete components into a membrane-type device, such as a switch.

A primary object of the present invention is a connection and mounting means for electrical components.

Another object is an electrical connection for use with rigid circuit boards which does not require the use of plated-through holes.

Another object is an electrical connection which is economical to make and reliable in operation.

Another object is an electrical connection which does not require any soldering.

Another object is an electrical connection which can be incorporated into a membrane switch panel.

Other objects will appear in the following specification, drawings and claims.

BRIEF DESCRIPTION OF THE DRAWINGS

FIG. 1 is a perspective view of a connector according to the present invention, with portions cut away and partially exploded to more clearly show the invention.

FIG. 2 is a section taken generally along lines 2—2 of FIG. 1.

FIG. 3 is a view similar to FIG. 2, showing an alternate embodiment.

DESCRIPTION OF A PREFERRED EMBODIMENT

This invention relates to electrical connections in printed circuit boards, switch panels and the like. A commonly encountered problem in printed circuit boards is incorporating discrete electrical components into the board. This has been done in the past by the use of soldered connections and doublesided circuit boards with plated-through holes. These techniques are expensive with the result that manufacturing and processing costs become the most expensive factors in the cost of circuit boards and switch panels.

The present invention provides an electrical connection which avoids the use of double-sided boards, plated-through holes and soldered connections. The connection of the present invention utilizes a polymer sheet which is wrapped around and adhesively secured to a panel with the electrical components disposed between the polymer sheet and the panel. This is shown in FIG. 1 where a connector is indicated generally at 10. It includes a substantially rigid board or panel 12. This may be a printed circuit board or a switch panel or other member of an electrical device. The panel 12 may have an opening 14 extending partially or completely therethrough. The opening receives a portion of an electrical component 16, in this case a light emitting diode (LED). The component 16 will typically have a pair of leads 18. A surface of the panel 12 may be coated with an adhesive material as at 20. In the arrangement shown, the leads 18 of the component 16 will contact the adhesive surface 20 to assist in holding the component in place.

An insulative sheet 22 holds the component 16 in place and provides the electrical connection to the component. In a preferred embodiment the sheet 22 includes a membrane portion 24 and a flap portion 26. The membrane portion 24 lies on one side of the panel 12. The flap portion is wrapped around an edge of the panel and lies on the other side of the panel. The flap 26 is pressed into contact with the adhesive surface 20, thereby securing the flap to the panel. The electrical component 16 is disposed between the flap portion of the sheet 22 and the panel 12. This secures the component in place.

A pair of conductive traces 28 and 30 are formed on the surface of the sheet 22 adjacent the panel. The traces extend to a conductive spot or pad, one of which is shown in hidden lines at 32. The contact spots are arranged to lie directly over the leads 18 of the electrical component 16. When the flap portion 26 is pressed into contact with the adhesive surface the spots 32 contact the leads 18, providing electrical connection to the component 16.

The sheet 22 may have a tail portion 34 extending therefrom. The traces 28 and 30 may also extend out onto the tail for connection to external apparatus.

FIG. 3 shows an alternate embodiment wherein the connection of the present invention is incorporated in a membrane switch panel. This embodiment uses all the parts of the embodiment described above. These parts will be given common reference numerals but will not be described again. The additional components of the alternate embodiment comprise the parts needed to form a membrane type switch. This includes a first set of electrical conductors 36 formed on one side of the panel 12. A second set of conductors 38 is formed on the membrane portion 24. The second set of conductors may comprise a pattern of interdigitated contacts while the first set of conductors includes shorting bars. A spacer 40 is disposed between the first and second sets of conductors. The spacer has openings as at 42 which permit contact between the conductor sets in response to selective pressure on the exterior surface of the membrane 24. Thus, there is a membrane switch panel on one side of the panel 12 and a discrete component attachment is afforded by the flap 26. The spacer 40 could be a separate layer of insulative material with holes punched therein. Or it could be an insulative layer applied in liquid form to either the panel or the membrane. This layer is then dried before the switch is assembled. It will be understood, of course, that the particular arrangement of the sets of conductors and the spacer is for illustrative purposes only and could be other than that shown. The same is true of the number and arrangement of electrical components and connecting traces. In addition, it is not necessary that the panel 12 be rigid. It could be a flexible substrate formed of the same material as the sheet member. Therefore, the invention is not to be limited to the specific showing rather, it is to include the variations apparent to those skilled in the art.

The embodiments of this invention in which an exclusive property or privilege is claimed are as follows:

1. A connector for attaching an electrical component to a panel, comprising an insulative sheet having conductive traces on it, the sheet lying against the panel and being adhesively secured thereto, the electrical component being disposed between the sheet and the panel, the sheet contacting the component and the adherence between the sheet and panel causing the sheet to clamp the component into engagement with the panel so that the sheet holds the component in place, and the traces being in contact with the component's leads to provide electrical connection.

2. The structure of claim 1 further characterized in that the electrical component is disposed at least partially below the surface of the panel.

3. The structure of claim 1 wherein the sheet comprises a membrane portion and a flap portion, the membrane portion lying on one side of the panel with the flap portion being wrapped around an edge of the panel and secured to the other side of the panel and further comprising first and second sets of conductors formed on said one side of the panel and the membrane portion respectively, an insulative spacer element having openings therein, the spacer being disposed between the membrane portion and said one side of the panel with the openings aligned with the sets of conductors such that the conductor sets, spacer and membrane form a membrane switch.

4. The structure of claim 3 wherein the electrical component is held in place by the flap portion of the sheet.

5. The structure of claim 1 or 3 wherein the sheet includes a tail portion.

6. The structure of claim 1 wherein the electrical component is a light emitting diode.

7. A membrane switch panel, comprising:
a substantially rigid panel;
at least one discrete electrical component;
an insulative sheet having a membrane portion and a flap portion, the membrane portion lying on one side of the panel with the flap portion being wrapped around an edge of the panel and adhesively secured to the other side of the panel, the electrical component being disposed between the sheet and the panel so that the sheet holds the component in place;
first and second sets of conductors formed on said one side of the panel and the membrane portion respectively,
a spacer having openings therein, the spacer being disposed between the sets of conductors such that the conductor sets, the spacer and the membrane form a membrane switch; and
conductive traces formed on the sheet and arranged to provide electrical connection to the component.

* * * * *